US006507927B1

(12) United States Patent
Kalliojärvi (10) Patent No.: US 6,507,927 B1
(45) Date of Patent: Jan. 14, 2003

(54) METHOD AND DEVICE FOR ESTIMATING THE RELIABILITY OF A DECODED SYMBOL SEQUENCE

(75) Inventor: Kari Kalliojärvi, Veikkola (FI)

(73) Assignee: Nokia Mobile Phones Ltd., Espoo (FI)

( * ) Notice: Subject to any disclaimer, the term of this patent is extended or adjusted under 35 U.S.C. 154(b) by 0 days.

(21) Appl. No.: 09/500,170

(22) Filed: Feb. 8, 2000

(30) Foreign Application Priority Data

Feb. 9, 1999 (FI) .................................................. 990249

(51) Int. Cl.$^7$ ............................................. H03M 13/00

(52) U.S. Cl. ...................................................... 714/795

(58) Field of Search ................................. 714/786, 795; 375/341

(56) References Cited

U.S. PATENT DOCUMENTS

| | | | | |
|---|---|---|---|---|
| 5,537,444 A | * | 7/1996 | Nill et al. ..................... | 375/341 |
| 5,684,811 A | | 11/1997 | Doran ......................... | 714/786 |
| 5,933,462 A | * | 8/1999 | Viterbi et al. ................ | 375/341 |
| 5,995,562 A | * | 11/1999 | Koizumi ....................... | 375/341 |
| 6,192,503 B1 | * | 2/2001 | Chennakeshu et al. ...... | 714/796 |

FOREIGN PATENT DOCUMENTS

| | | |
|---|---|---|
| EP | 0606724 A1 | 7/1994 |
| WO | WO 97/13327 | 4/1997 |
| WO | WO 97/43834 | 11/1997 |

OTHER PUBLICATIONS

Forney et al., Generalized Minimum–Distance Decoding of Euclidean–Space Codes and Lattices, IEEE, p. 1992–2026, 1996.*

Ryan, Comparative performance between droup–out detection and Viterbi reliability metric erasure flagging, IEEE, p. 2898–2900.*

Loeliger, A practical Reliability metric for block codes used on binary–input channels, IEEE, p. 405–408, 1990.*

"Viterbi Decoding Algorithm For Convolutional Codes With Repeat Request", H. Yamamoto et al., IEEE Transactions On Information Theory, vol. IT–26, No. 5, pp. 540–547, 1980.

"A Reliability Output Viterbi Algorithm With Applications To Hybrid ARQ", A.R. Raghavan et al., IEEE Transactions On Information Theory, vol. IT–44, No. 3, pp. 1214–1216, 1998.

"List And Soft Symbol Output Viterbi Algorithms: Extensions And Comparisons", Nill et al., IEEE Transactions On Communications, vol. 43, No. 2/3/4, 1995.

"Method And Arrangement For The Reliable Transmission Of Packet Data", FI 990250.

* cited by examiner

Primary Examiner—Albert Decady
Assistant Examiner—Shelly A Chase
(74) Attorney, Agent, or Firm—Perman & Green, LLP (57) ABSTRACT

A method is presented for estimating the reliability of a data sequence after Viterbi decoding. Within the Viterbi decoding, corresponding to an initial time instant, the possible initial states for the Viterbi decoding are established (801). After proceeding to a subsequent time instant (804), at each state corresponding to the present time instant, a surviving trellis path is selected among the trellis paths coming into that state (805). The steps of proceeding and selecting are repeated until a final time instant (807), and at said final time instant a final surviving trellis path is selected to represent the decoded data sequence. At the selection step of the Viterbi decoding, a characteristic reliability metric is updated separately in association with each selected surviving trellis path (806). After selecting a final surviving trellis path, its characteristic reliability metric is converted to a sequence reliability statistic corresponding to the estimated reliability of the decoded data sequence (809, 810–814).

10 Claims, 5 Drawing Sheets

*) d=MAXNUM

Fig. 3

*) d=MAXNUM

METHOD AND DEVICE FOR ESTIMATING THE RELIABILITY OF A DECODED SYMBOL SEQUENCE

TECHNOLOGICAL FIELD

The invention concerns generally the field of decoding an encoded digital signal after transmission through a noisy transmission channel. Specifically the invention concerns the problem of estimating the correctness of a certain decoded sequence of digital symbols.

BACKGROUND OF THE INVENTION

The widely known principle of convolutional encoding and its further developed forms like turbo encoding and concatenated convolutional encoding are commonly used for protecting a digital transmission against the detrimental error-introducing effects of a noisy transmission channel. Encoding is typically applied to discrete sequences of digital information, like frames or Protocol Data Units (PDUs). A receiver arranged to receive such an encoded transmitted sequence will apply a so-called Viterbi decoding algorithm to remove the encoding and to reconstruct the original digital sequence. As a background of the present invention we will briefly discuss some known features of Viterbi decoding.

Figure 1A:
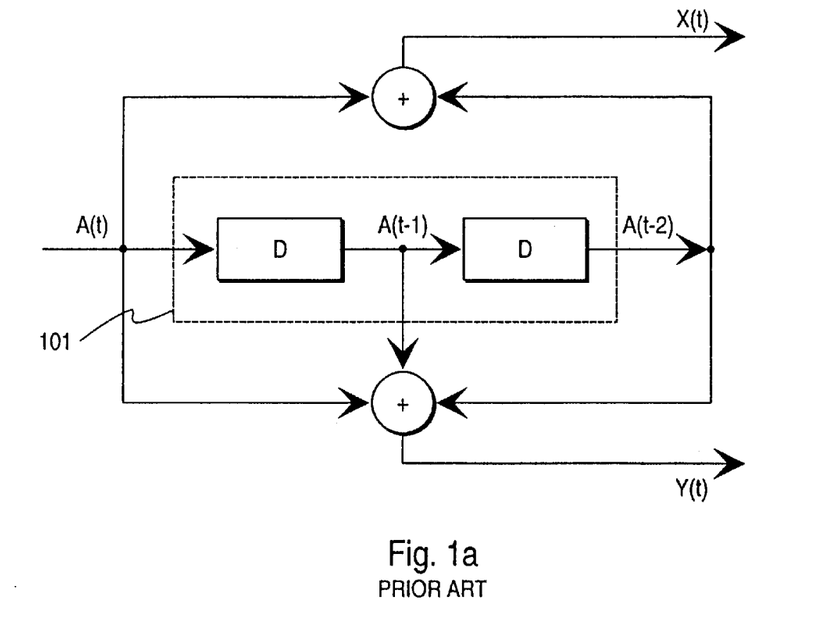
FIGS. 1a and 1b illustrate some known principles of convolutional encoding and Viterbi decoding.

A symbol sequence that has been constructed with a basically convolutional encoder of some kind will consist of a number of discrete symbols. Each symbol may be seen to represent k bits. Most practical implementations use binary convolutional encoding where the symbol length is one bit, although consecutive symbols may be grouped to form states. FIG. 1a illustrates a simple convolutional encoder that produces a ½ rate convolutional code. Input bits A(t) are fed from the left at the rate of one bit per unit time and two output bits X(t) and Y(t) per unit time are obtained at the right. The memory 101 of the convolutional encoder is represented as a shift register or an array of serially concatenated one bit memory cells (e.g. D-type flip-flops). The state of an encoder is represented as the contents of its memory, so the encoder of FIG. 1a a has the possible states 00, 01, 10 and 11. The length of the shift register determines the number of output bits in one output line to the values of which a single input bit has an influence: said number of output bits is known as the constraint length and in FIG. 1a it is three. An output bit may be calculated from an input bit and the known state of the encoder. For example in FIG. 1a, Y(t)=A(t)+A(t−1)+A(t−2) and the bit which at time t is known as A(t) will also influence the value of the output bits Y(t+1) and Y(t+2).

Figure 1B:
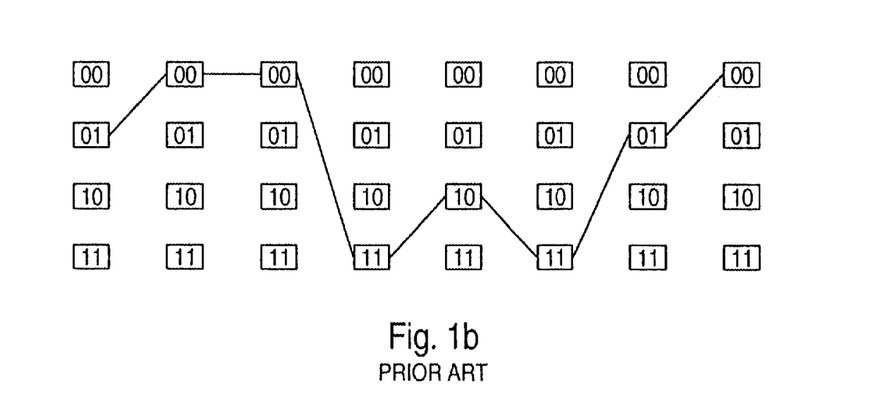

FIG. 1b illustrates a state matrix showing all possible states of the encoder of FIG. 1b at eight consecutive time instants. The correct sequence to be found through decoding corresponds to a path through the state matrix from left to right so that in each column the path goes through exactly one state. An exemplary path is shown in FIG. 1b as a continuous line. A graph showing states and paths through them is known as a trellis diagram and a path is also known as a trellis path.

It is a feature of the convolutional encoding and Viterbi decoding principle that from each known state there are only a certain number of allowed transitions to following states. A Viterbi decoder will find a number of possible paths through the trellis diagram by starting from a certain first state and propagating with allowed transitions from state to state. The observed transitions in the received, error-corrupted symbol sequence are seldom unequivocal but give rise to different interpretations with certain transition probabilities. The Viterbi decoder will use the information about the allowed state transitions and the observed transition probabilities to construct the possible trellis paths. In theory it would be possible to simulate every possible trellis path in the receiver and calculate its probability value in the light of the received sequence; however, the practical sequences are so long and the timing constraints are so tight that the exponentially growing number of possible paths would soon make the problem computationally impossibly complex. Practical Viterbi algorithms use certain reliability metrics to select at each state a single "surviving" path or a limited number of "candidate" paths to go on with. The path which provides the best estimated reliability in the log-likelihood sense at the final state will be declared to represent the decoded digital sequence.

In some cases the Viterbi algorithm will not be able to provide a single most probable path through the trellis diagram, or the most probable path still contains errors. Several approaches have been proposed for dealing with such a situation, one of them having been published in the article H. Yamamoto and K. Itoh: "Viterbi Decoding Algorithm for Convolutional Codes with Repeat Request", IEEE Transactions on Information Theory, vol. IT-26, no.5, pp. 540–547, September. 1980, which is incorporated herein by reference. In the proposed method the surviving path for some i:th state is declared as unreliable if the metric difference between the two best paths to this state is smaller than a given threshold value or if the winning surviving path has at some previous time instant been declared as unreliable. If, at some time instant, the surviving paths to every state are declared as unreliable, the whole received sequence will be marked as unreliable and an erasure of information is declared. An advantage of the proposed method is that it requires only minimal overhead in processing or storage capacity when compared to straightforward Viterbi decoding. The article A. R. Raghavan and C. W. Baum: "A Reliability Output Viterbi Algorithm with Applications to Hybrid ARQ", IEEE Transactions on Information Theory, vol. IT-44, no.3, pp. 1214–1216, May. 1998, also incorporated herein by reference, proposes another approach in which a conditional a posteriori probability is calculated for errors in the decoded sequence. The theoretical performance of the latter approach is good but it requires a prohibitively complex calculational arrangement for practical applications in present-day communication devices.

A so-called list decoding or look-up decoding approach is also known in which the Viterbi decoding algorithm will not give a single output sequence with the highest log-likelihood value but a list of mutually alternative sequences in the order of diminishing likelihood values. A CRC (Cyclic Redundancy Check) checksum calculation or a similar other decoding method is then used to detect whether the n:th sequence in the list contains errors, starting with n=1. If there are errors in a certain sequence at place n in the list, the sequence at place n+1 is tried next until either an error-free sequence is found or all sequences in the list have been tried. Such an approach is known from e.g. the patent publication EP 0 606 724 A1 and the article Nill et al.: "List and Soft Symbol Output Viterbi Algorithms: Extensions and Comparisons", IEEE Transactions on Communications, Vol. 43, No. 2/3/4, February/March/April 1995. An advantage of the list decoding approach is that in many cases it saves time: making another "guess" of the correct form of the received sequence (in the form of taking another sequence from the list) and performing a CRC check is enormously faster than asking for and providing a retransmission from the transmitting device, so even if in some cases the whole list has to be exhausted and even then a restransmission must be requested, it suffices that for a significant number of times a retransmission can be avoided by actually finding the correct error-free sequence on the list.

A drawback of the list decoding principle is that it is quite memory-intensive: a number of mutually alternative sequences (and even the associated state-specific reliability values) must be temporarily stored in the receiving device, and only one of the stored sequences will ultimately be used. To reduce the amount of required storage capacity the patent publication WO 97/43834 proposes the concept of a decision window. A decision window is a structure containing a fixed number of columns from the trellis diagram. Initially the decision window is set so that at a certain symbol around the middle of the decision window all candidate paths will converge into a single state. It is a known characteristic of trellis paths that the nearest alternative (in the log-likelihood sense) to the sequence regarded as the most reliable one will diverge from it at a certain first time instant or column in the state matrix and converge again with it at a certain later time instant or column. The decision window -based list decoding method takes advantage of this known feature by constructing the alternative sequences by back-propagating from the common state of the decision window. Although the decision window concept helps to keep the memory requirements of list decoding in reasonable proportions, it is still quite complex and demanding in terms of computational capacity.

SUMMARY OF THE INVENTION

It is an object of the present invention to provide a method and a device for effectively estimating decoding reliability in a Viterbi-type decoding arrangement with low complexity in processing and hardware.

The objetcs of the invention are achieved by keeping track of the smallest metric difference between a surviving path and the best competing path throughout the span of the surviving path. Such tracking is separately made for each surviving path.

The method according to the invention is characterised in that it comprises the steps of
- at a certain step of Viterbi decoding, updating a characteristic reliability metric separately in association with each selected surviving trellis path and
- after selecting a final surviving trellis path, converting its characteristic reliability metric to a sequence reliability statistic corresponding to the estimated reliability of the decoded data sequence.

The invention also applies to a decoding apparatus, the characteristic feature of which is that it comprises means for updating, at each state associated with the intermediate or final time instants of Viterbi decoding, a characteristic reliability metric separately in association with each selected surviving trellis path and means for converting the characteristic reliability metric of the selected final surviving trellis path to a sequence reliability statistic corresponding to the estimated reliability of the decoded data sequence.

Additionally the invention applies to a receiving apparatus which is characterised in that it comprises
- means for Viterbi decoding subunits by propagating a number of trellis paths from a number of allowed states associated with a certain initial time instant within a subunit to a number of allowed states associated with a certain final time instant within the same subunit through a number of allowed states associated with certain intermediate time instants, and by selecting, at each state associated with the intermediate time instants, a surviving trellis path and at the final time instant a final surviving trellis path,
- means for updating, at each state associated with the intermediate or final time instants, a characteristic reliability metric separately in association with each selected surviving trellis path and means for converting the characteristic reliability metric of the selected final surviving trellis path to a sequence reliability statistic corresponding to the estimated reliability of the decoded data sequence, for estimating the decoding reliability of each subunit contained within a superunit,
- error detection decoding means for error detection decoding a superunit and detecting the number of errors in it and
- retransmission control means for identifying a predefined number of the subunits within the decoded superunit as suspicious on the basis of the estimated reliabilities of the subunits and the number of detected errors in the decoded superunit and for generating retransmission requests concerning the subunits identified as suspicious.

The invention exploits the known characteristic of Viterbi decoding that the reliability of a certain surviving path can be derived from the metric differences between the surviving path and the respective competing paths. In general, the closer a competing path gets in the sense of metric difference, the lower the reliability of the surviving path. According to the invention, a measure of the closest metric difference is established and maintained for each surviving path through the whole span of the path. After completing the Viterbi decoding the decoded sequences may be characterised by a sequence reliability statistic which is equal to or calculated from the maintained measures of closest metric difference.

An advantageous application where the calculated sequence reliability statistics may be used is one where a number of discretely decodable subsequences are covered by a single CRC checksum or similar error detection means that give an indication of a detected error without closer reference to the location of the error in the covered sequences. If the error detection means indicate that an error has occurred, the decoded subsequences may be arranged in an estimated reliability order according to their sequence reliability statistics. It is most probable that the error is located in the subsequence with the sequence reliability statistic indicating the weakest estimated reliability. If the transmission system allows for retransmissions on the subsequence level, the receiving device where the error has been detected may ask for the transmitting device to retransmit the most unreliable subsequence(s) and/or some additional information corresponding to it (or them) without the need to retransmit the whole CRC-protected group of subsequences.

BRIEF DESCRIPTION OF DRAWINGS

The novel features which are considered as characteristic of the invention are set forth in particular in the appended Claims. The invention itself, however, both as to its construction and its method of operation, together with additional objects and advantages thereof, will be best understood from the following description of specific embodiments when read in connection with the accompanying drawings.

FIGS. 1a and 1b have been referred to in the foregoing description of prior art, so the following discussion of the preferred embodiments of the invention will refer primarily to FIGS. 2 to 9.

DETAILED DESCRIPTION OF THE INVENTION

Figure 2:
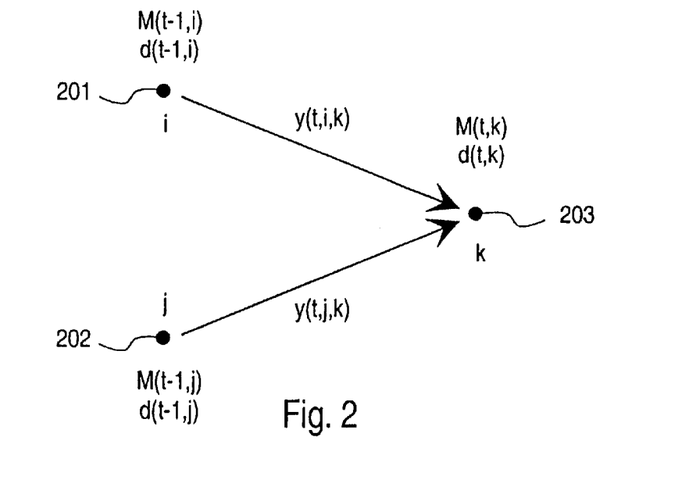
FIG. 2 illustrates some notations used in the description of the invention.

FIG. 2 illustrates two alternative states 201 and 202 in a first column of a trellis diagram, corresponding to a time instant (t−1), and a third state 203 in the subsequent column of the trellis diagram, corresponding to a time instant t. We may suppose that allowed state transitions exist from both states 201 and 202 to state 203: these state transitions are represented in FIG. 2 as arrows. The columns of the trellis diagrams in general may be designated as time instants with integer indices, like the indices t−1 and t mentioned above. We will also designate state 201 as the i:th state, state 202 as the j:th state and state 203 as the k:th state. As FIG. 2 may be taken from any arbitrary part of a trellis diagram, the indices may have any non-negative integer values. We will use the following general notation where the indices do not specifically refer to FIG. 2:

$$M(t,i)$$

The accumulated reliability metric of any state i at a time instant t. Accumulation of reliability metrics is a basic characteristic of Viterbi decoding and is disclosed in any basic reference work on the field.

$$y(t,i,j)$$

The metric increment for a state transition from state i to state j of which state j belongs to the time instant t. Also the definition of metric increments is known as such from the technology of Viterbi decoding.

$$d(t,i)$$

The characteristic metric difference, calculated for state i at time t, of the surviving path. It is calculated as the metric difference of the surviving path and the best non-surviving (competing) path that has merged with the surviving path at time ≤ t. The selection of surviving paths and best non-surviving paths is known from the technology of Viterbi decoding; we will give a more detailed explanation for the calculation of d(t,i) below.

$$m(t,i,j)=M(t-1,i)+y(t,i,j)$$

The supposed accumulated metric which would result from a transition from state i (at time instant t−1) to state j (at time instant t). It should be noted that there may be a number states i from which an allowed transition to state j exists. Given the definition of M(t,i) above, the known characteristics of the Viterbi decoding require that for the surviving path at state j, $M(t,j)=\min_i(m(t,i,j))$ when the reliability metrics are so defined that a low value of the reliability metric indicates good reliability. If a known alternative definition of the reliability metric is used which gives a high value of the reliability metric as an indication of good reliability, then for the surviving path at state j, $M(t,j)=\max_i(m(t,i,j))$.

$$d(t,j)=\min(d(t-1,x), m(t,y,j)-m(t,x,j))$$

The calculation of the characteristic metric difference according to the preferable embodiment of the invention; here x refers to the state immediately antecedent to state j and belonging to the path selected as the survivor at state j, and y refers to the state immediately antecedent to state j and belonging to the path designated as the closest competing path at state j. In other words, at state j the difference between the accumulated metrics of the surviving path and its closest competitor is calculated and compared against the previous characteristic metric difference of the surviving path. The smallest of these is selected as the new characteristic metric difference of the surviving path. A still further equivalent definition is that after each selection of a surviving path, it is checked whether the competing paths that merged with the selected surviving path at the present state came closer to the survivor (in terms of the accumulated reliability metric) than those competing paths that had merged with the selected surviving path at some previous states. If the alternative definition of the reliability metric is used which gives a high value of the reliability metric as an indication of good reliability, then for the surviving path at state j the indices x amd y switch places, or d(t,j)=min(d(t−1), m(t,x,j)−m(t,y,j)).

The above-given definitions make it possible to establish and maintain a characteristic metric difference in association with each surviving trellis path at all states except the first one (t=0). The so-called initialization of the metric difference calculation, or the calculation of the characteristic metric differences for the first state or more generally the beginning of the trellis diagram, may take some alternative forms depending on whether or not there is a single known starting state.

Figure 3:
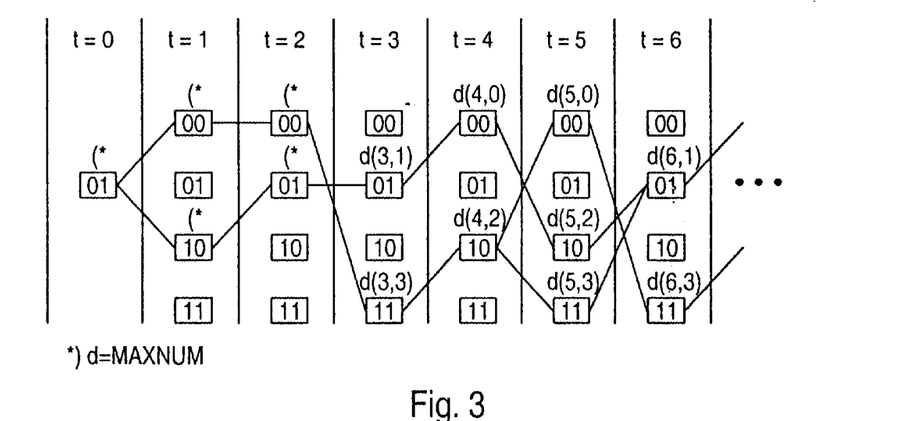
FIG. 3 illustrates the beginning of a certain trellis diagram.

FIG. 3 illustrates the beginning of a trellis diagram in a case where there is a single known starting state 301 at the first time instant (t=0). At the rest of the time instants there are in general $2^k$ possible states where k is the memory length of the corresponding convolutional encoder (here k=2). The state indices in decimal notation are 0,1,2 and 3 from top to bottom so that indice 0 corresponds to the binary state 00, indice 1 to the binary state 01, indice 2 to the binary state 10 and indice 3 to the binary state 11. It is a known characteristic of convolutional encoding and Viterbi decoding that the closest competing paths that diverge at some time instant may only converge after k+1 subsequent time instants where k+1 is the constraint length of the convolutional encoder (here k+1=3). Consequently in the case of FIG. 3 it is not necessary to calculate the characteristic metric differences before the time instant t=k+1. The establishment of paths and calculation of their accumulated metric values may proceed according to known Viterbi decoding procedures. To literally comply with the above-given definitions we may postulate that for all paths, d(t,j)= MAXNUM whenever t<k+1; here MAXNUM refers to such a large number that it will always be larger than any reasonable metric difference between two paths.

Figure 4:
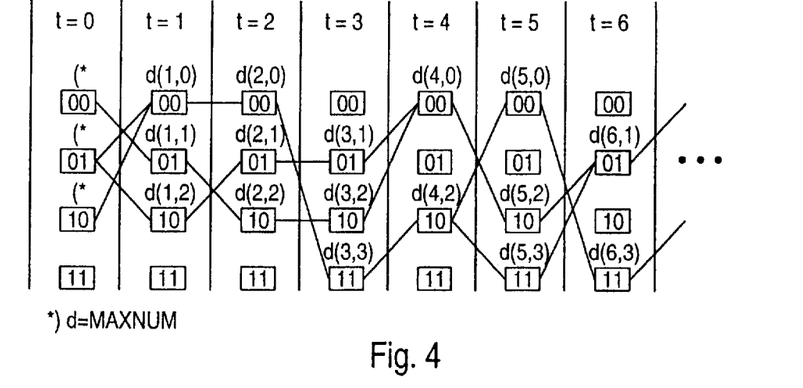
FIG. 4 illustrates the beginning of a certain other trellis diagram.

FIG. 4 illustrates the beginning of a trellis diagram in a case where there are in general $_2k$ possible states; here k=2. In this case it is possible that paths merge before the time instant t=k+1 so the calculation of the characteristic metric differences for each surviving path must be started already from the time instant t=0. Here we may initialize the characteristic metric differences so that for all paths, d(0, j)=MAXNUM for all j<$2^k$. All states being allowable as starting states corresponds to continuous convolutional encoding between subsequent blocks of data. We will return to the advantageous features of such arrangements later.

Next we will discuss the termination of the Viterbi decoding at the end of a sequence. Here again we may differentiate between two cases: one where the coding arrangement is arranged to terminate each encoded sequence into a known termination state and another where several termination states are possible. The latter again refers to continuous convolutional encoding between subsequent blocks of data. We will first deal with the single termination state case.

Figure 5:
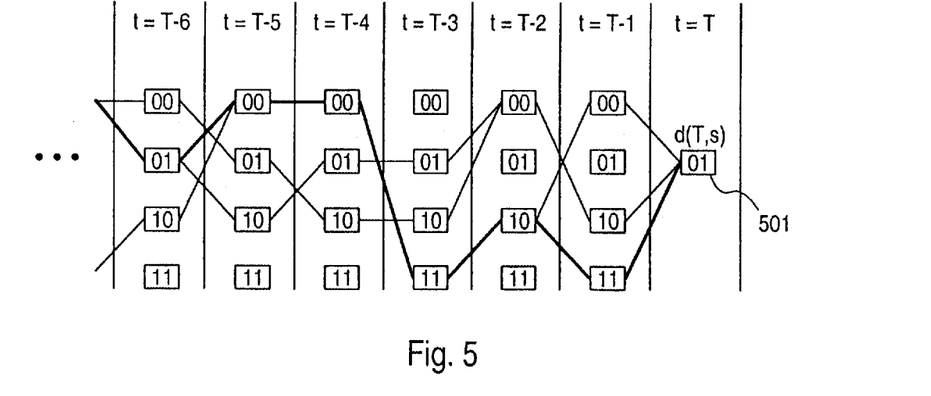
FIG. 5 illustrates the final stages of a certain trellis diagram.

FIG. 5 illustrates the final columns of a trellis diagram where the last column t=T contains only a single allowed termination state 501, also indiced as state s (following the notation used in FIGS. 3 and 4, s=1). There may be several paths that terminate at this state, marked as continuous lines between states. The regular Viterbi decoding algorithm will select one of them as the final surviving path: in FIG. 5 an assumed final surviving path is marked as a thick line. The definitions given above can be used to obtain the characteristic metric difference d(T,s) for the final surviving path. The bit sequence represented by the final surviving path will become the decoded sequence. One of the objects of the invention was to provide a sequence reliability statistic or a value that would describe the estimated reliability of a completely decoded sequence of data. We may designate the sequence reliability statistic as p; the most natural alternative in the case of FIG. 5 is to take ρ=d(T,s).

Figure 6:
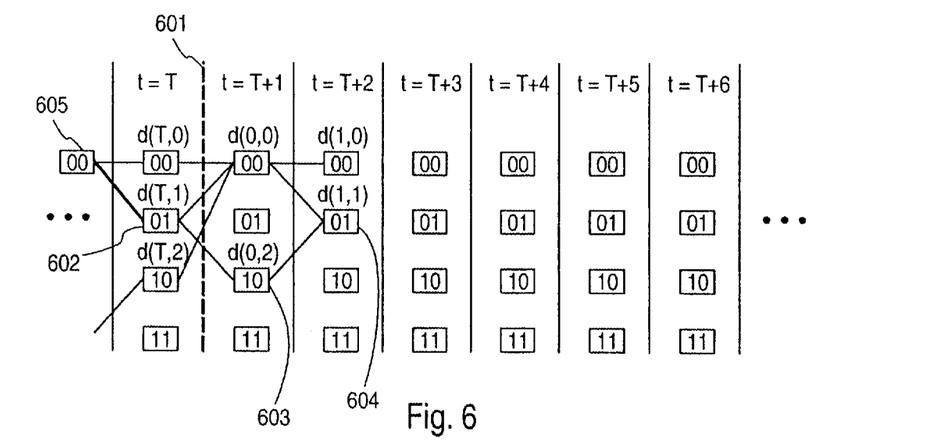
FIG. 6 illustrates the final stages of a certain other trellis diagram.

FIG. 6 illustrates a situation where there are $2^k$ possible termination states (here k=2) at the final time instant t=T. The thick vertical broken line 601 marks the border between the terminating trellis diagram and the trellis diagram of the next consecutive encoded sequence. It is immediately seen that the beginning of the next trellis diagram resembles that of FIG. 4 above. The abundance of possible terminating states allows for several surviving paths to exist at the borderline. The regular Viterbi decoding algorithm calls for the calculation of the final accumulated reliability metrics M(T,i) for all surviving paths (for all i) and the selection of the path with the most advantageous M value as the representative of the decoded sequence. The last leg of an assumed final surviving path is shown as a thick line, illustrating that the final surviving path will terminate at state 602. A straightforward generalization of the regular Viterbi principle to the invention would call for the calculation of the values d(T,i) for all i and the selection of the d value of the selected final surviving path as the sequence reliability statistic ρ of the decoded sequence. The invention does not rule out such a solution. However, such an approach would neglect the fact that some path(s) may have diverged from the final surviving path less than k+1 (constraint length) time instants before and not merged again yet: such last-minute divergers might have a drastic effect on the d value of the final surviving path.

An advantageous way of taking into account the last-minute diverger problem is to continue the calculation of the characteristic metric differences over the borderline between subsequent trellis diagrams at least to the time instant t=k-1 of the next consecutive trellis diagram (remembering that the first time instant in the next diagram will be t=0). We want to emphasize that such a calculation will in no way affect the selection of the final surviving path, the calculation of the regular accumulated Viterbi metrics in the previous trellis diagram or the handling of the next consecutive trellis diagram. It is very likely that if the last-minute divergers from the final surviving path in the previous trellis diagram are to qualify as close competitors to the final surviving path (and thus affect its d value), after k time instants in the next consecutive trellis diagram they will have merged again with the continuation of the final surviving path. The sequence reliability statistic ρ for the completely decoded sequence will then be equal to the value d(T+k, x) calculated for the continuation of the final surviving path at state x of the time instant t=k-1 in the next trellis diagram.

FIG. 6 illustrates the calculation of the d values up to the state t=T+2 (here k=2). We may assume, for example, that the extension of the final surviving path goes through state 2, designated as 603, of time instant t=T+1 and terminates at state 1, designated as 604, of time instant t=T+2, and there is a last-minute diverger that diverged from the final surviving path at state 0 of time instant t=T-1, designated as 605, and converged again at the same terminating state 604 at time instant t=T+2. The sequence reliability statistic ρ for the completely decoded sequence represented by the final surviving path will then be equal to the value d(1, 1) calculated for the continuation of the final surviving path at state 1 of the time instant t=1 in the next trellis diagram.

Figure 7:
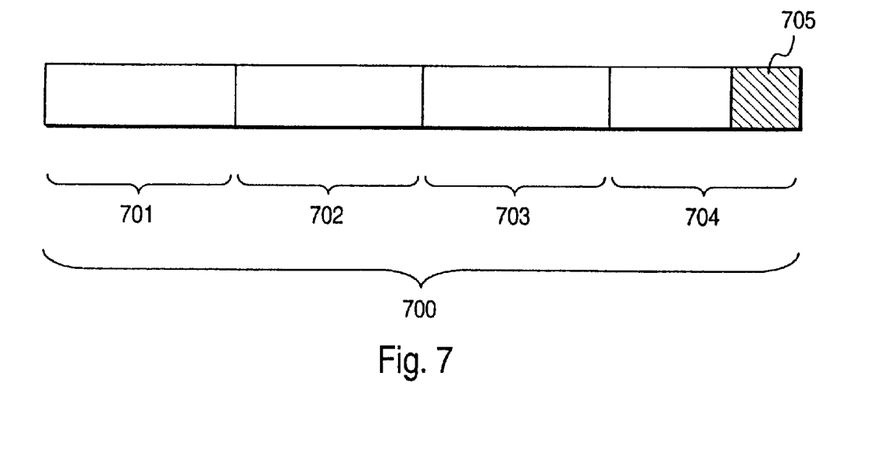
FIG. 7 illustrates a frame structure that is advantageously applicable with the invention.

FIG. 7 illustrates a frame structure that is advantageously used together with the invention as a part of a selective hybrid ARQ method (Automatic Repeat reQuest) as described in a co-pending Finnish patent application FI 990250, "Menetelmä ja järjestelmä pakettimuotoisen datan luotettavaksi siirtäimiseksi". A frame 700 comprises four subsequences of data 701, 702, 703 and 704. After the fourth subsequence there is a CRC field 705 containing a checksum calculated over the whole content of the frame without paying attention to the borderlines between subsequences. The frame has also been continuously convolutionally encoded over its whole length without paying attention to the borderlines between subsequences or between the fourth subsequece 704 and the CRC field 705. Only the CRC field contains tail bits (not specifically shown in FIG. 7) the purpose of which is to terminate the convolutional encoder at a single known termination state. At the beginning of the convolutional encoding of the frame the convolutional encoder has been initialized to a known state so at the first time instant of the trellis diagram for the first subsequence 701 there is only one allowable state. At the beginning of the trellis diagrams for all other subsequences 702, 703 and 704, as well as at the termination of the trellis diagrams of all subsequences there are multiple allowed states.

According to a preferable embodiment of the invention, the Viterbi decoding of a frame structure according to FIG. 7 proceeds as follows. The decoding of the first subsequence 701 is started from a known allowable first state. At the termination of the Viterbi decoding of the first subsequence a final surviving path is selected according to the regular Viterbi decoding rules and the decoded first subsequence is formulated accordingly. The characteristic metric difference for the selected final surviving path is formulated by extending the metric difference calculation into the second subsequence as described above in connection with FIG. 6, and it becomes the first sequence reliability statistic $ρ_1$. The decoding of the second subsequence 702 starts from multiple allowed first states as described above in connection with FIG. 4 and terminates again with an associated extension of the metric difference calculation into the next consecutive (third) subsequence. The termination of the decoding yields a final surviving path and a corresponding decoded second subsequence, and the characteristic metric difference obtained through the extended calculation becomes the second sequence reliability statistic $\rho_2$. The decoded third and fourth subsequences and the correponding third and fourth sequence reliability statistics $\rho_3$ and $\rho_4$ are obtained in similar fashion. The Viterbi decoding of the CRC field follows the regular Viterbi decoding rules; the calculation of a sequence reliability statistic $\rho_{CRC}$ may or may not be included in the process.

After the Viterbi decoding has been completed, error detection decoding is performed by calculating a new CRC checksum from the decoded subsequences. If no errors are detected, the decoded subsequences are accepted without using the sequence reliability statistics for anything. However, if the error detection decoding indicates that the frame contains an error or a number of errors, a question arises about the possible location of the error(s). CRC methods do not allow the detection of the number of errors; they only indicate whether there are errors or not. Other error detection coding methods exist that allow also the (at least approximate) number of errors to be indicated. The invention is applicable with all these kinds of error detection coding methods.

Let us assume that the error detection decoding indicates the presence of errors. Let us further assume that one of the sequence reliability statistic values $\rho_1$, $\rho_2$, $\rho_3$ and $\rho_4$ is significantly lower than the others, indicating that the estimated reliability of one decoded subsequence is significantly weaker than that of the other decoded subsequences. It is then natural to assume that the errors were within the subsequence with the lowest sequence reliability statistic value, whereby a retransmission concerning that subsequence may be requested. In other cases the number of the indicated errors as well as the mutual magnitude relations of the sequence reliability statistic values may vary, requiring different measures to be taken (retransmission requests concerning more than one subsequence, retransmission requests concerning all subsequences for which the sequence reliability statistic value is lower than a predetermined threshold etc.). Such cases and appropriate measures have been described in more detail within the previously mentioned co-pending Finnish patent application. It is even possible to declare the decoded sequences as error free despite of a CRC mismatch if the sequence reliability statistic values $\rho_1$, $\rho_2$, $\rho_3$ and $\rho_4$ are very high in comparison with a calculated sequence reliability statistic $\rho_{CRC}$ for the CRC field. The feature important to the present invention is that there exists a way to evaluate the relative reliability of the decoded subsequences, through the use of the sequence reliability statistic values according to the present invention.

It is to be noted that the above-given formulae for the calculation of the characteristic metric difference and the sequence reliability statistic are not strictly limiting to the invention, although they are regarded as providing an advantageously low level of complexity together with high comprehensibility. For example scaling factors that take into account the length of the decoded sequence may be added to the calculation of the sequence reliability statistic without departing from the scope of the appended claims.

To summarize with, advantageous embodiments of the method according to the invention and the apparatus according to the invention are briefly described with reference to FIGS. 8 and 9.

Figure 8:
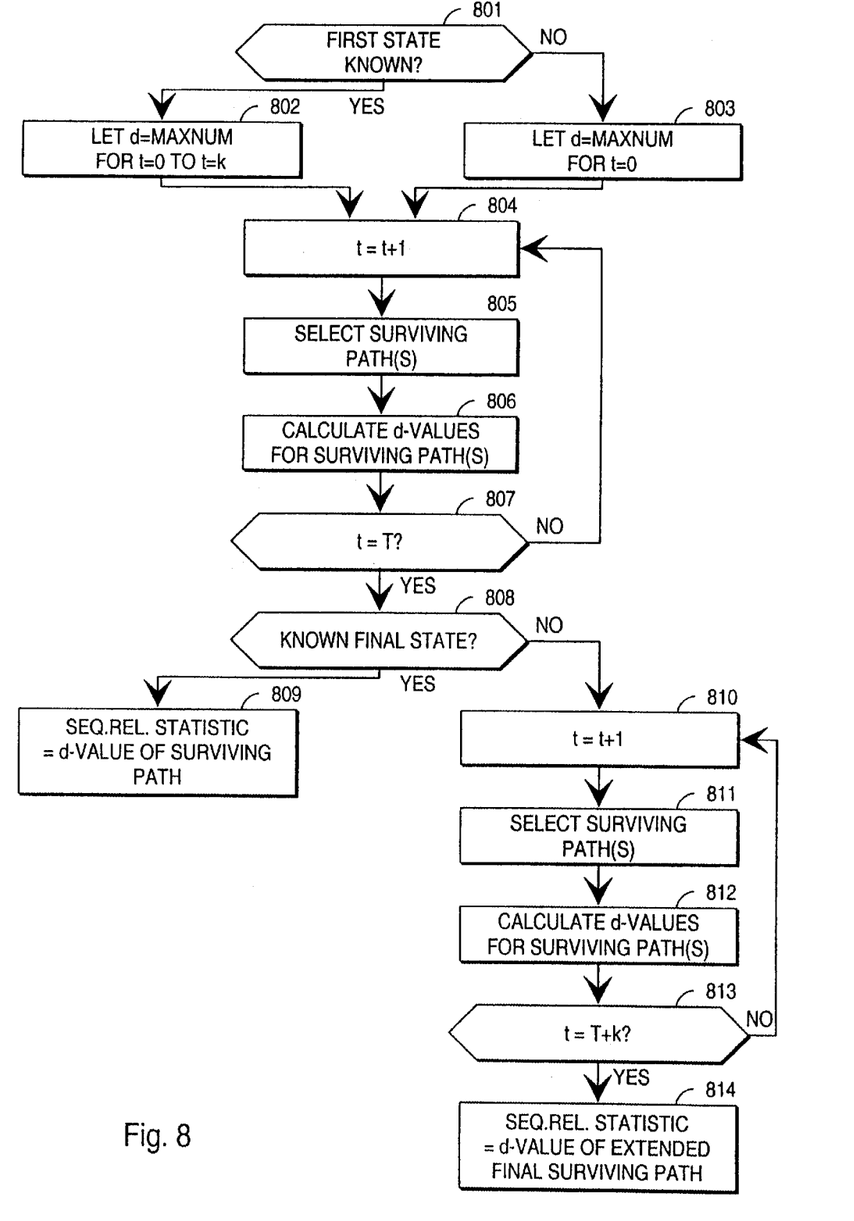
FIG. 8 is a flow diagram representation of a method according to the invention and FIG. 9 is a block diagram representation of an apparatus according to the invention.
Figure 9:
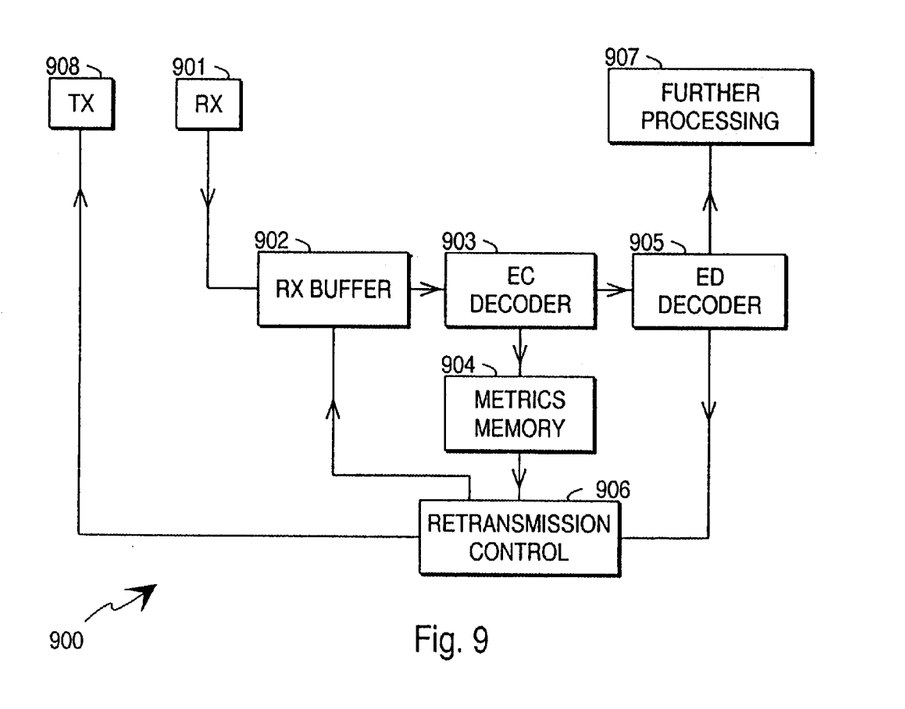

At stage 801 of FIG. 8, at the beginning of the Viterbi decoding of a convolutionally encoded sequence, an initialization scheme is selected according to whether or not the initial state is known. A known initial state allows for the d values to be initialized to a large value up to the time instant t=k (stage 802), whereas an unknown initial stage only allows for such an initialization at t=0 (stage 803). Stages 804 to 807 constitute a loop which is circled until the final symbol of the sequence has been reached (t=T). At each time instant the regular Viterbi-type selection of surviving paths is made (stage 805) and the characteristic reliability metric for each surviving path is calculated (stage 806). At stage 808 either the sequence reliability statistic for the completely decoded sequence is selected to be the d value (characteristic reliability metric) of the final surviving path (stage 809), or an extended calculation is entered. Within the latter alternative the loop of stages 810 to 813 is circled until the extension has covered k time instants, where k is the memory length of the convolutional encoder. The selection of surviving paths and calculation of d values finally yields, at stage 814, a corrected d value for the final surviving path which was actually already selected at the last visit to stage 805. FIG. 9 is a schematic representation of a receiving device 900 according to an advantageous embodiment of the invention. A receiver unit 901 is arranged to physically receive the transmissions of the transmitting device and to convert them to a form suitable for decoding. A buffer memory 902 with an incorporated recombination logic (not separately shown) is used to temporarily store the undecoded sequences to prepare for the potential introduction of retransmitted additional information and to take care of the actual recombination of the original sequence and the retransmitted additional information. The output of the buffer memory is connected to an error correction decoder 903 which is arranged to perform the error correction (Viterbi) decoding and to store the d values or characteristic reliability metrics as well as the final sequence reliability statistics into a metrics memory 904. An error detection decoder 905 is further arranged to decode the error detection code and to announce the eventual detection of errors, or even the number of detected errors, to the retransmission control unit 906. The error detection decoder 905 has also an output for outputting the error-free sequences into a further processing block 907 which is arranged to process further the decoded sequences. The retransmission control unit 906 is arranged to generate retransmission requests when necessary on the basis of the information it obtains from the blocks 905 and 904 and to transmit the retransmission requests through a transmitter unit 908. The retransmission control unit 906 also controls the deletion of obsolete (decoded and declared error-free, or declared obsolete due to an expired time limit) sequences from the buffer memory 902.

In its basic form the invention calls for maintaining only a single value as a characteristic reliability metric for each surviving path through the trellis diagram. However, it may happen that the trellis diagram is not particularly long and the number of surviving paths that are handled during the decoding of a single sequence is reasonable. In such a case it may be advantageous to also separately store the calculated characteristic reliability metrics at each time instant throughout the decoding. The advantage of such an arrangement arises from the possibility of afterwards analysing the trends in the magnitude of the characteristic reliability metric of the finally selected surviving path, which is to represent the decoded sequence. It may happen, for example, that for a certain number of time instants from the beginning of the sequence the characteristic reliability metric value of the final surviving path remains quite high, but at some stage it drops steeply. If the sequence is then detected to contain an error, it is most probable that the error occurred around the drop in the characteristic reliability metric value. Many kinds of action may be taken when the approximate location of the error is known: for example a retransmission may be requested with added redundancy or other kind of special attention paid to the part of the sequence where the error most probably resided.

Previously we have only presented the case of multiple sequences under a single error detection code as a potential application area of the invention. However, the actual applicability of the invention is much wider. Other applications include but are not limited to the declaration of erasures, signal quality estimation and different combinations with error detection decoding operations.

What is claimed is:

1. A method for estimating the reliability of a decoded data sequence after Viterbi decoding, comprising the steps of
   a) corresponding to an initial time instant, establishing the possible initial states for the Viterbi decoding,
   b) proceeding to a subsequent time instant,
   c) at each state corresponding to the present time instant, selecting a surviving trellis path among the trellis paths coming into that state and updating a characteristic reliability metric separately in association with each selected surviving trellis path,
   d) repeating steps b) and c) until a final time instant, and at said final time instant selecting a final surviving trellis path to represent the decoded data sequence, and
   e) after selecting a final surviving trellis path, converting its characteristic reliability metric to a sequence reliability statistic corresponding to the estimated reliability of the decoded data sequence.

2. A method according to claim 1, wherein step a) of the Viterbi decoding corresponds to the establishment of a single possible initial state for the Viterbi decoding; a memory length of a convolutional encoder used to previously encode the encoded data is known; and at all time instants that are closer than the known memory length to the initial time instant, the step of updating said characteristic reliability metrics corresponds to setting all characteristic reliability metrics equal to a fixed maximum value.

3. A method according to claim 1, wherein step a) of the Viterbi decoding corresponds to the establishment of a multitude of possible initial states for the Viterbi decoding; and at the initial time instant, the step of updating said characteristic reliability metrics corresponds to setting all characteristic reliability metrics equal to a fixed maximum value.

4. A method according to claim 1, wherein the step of updating the characteristic reliability metrics corresponds to, in the absence of any setting equal to a fixed maximum value, calculating the value of the characteristic reliability metric according to the formula $d(t,j)=\min(d(t-1,x), m(t,y,j)-m(t,x,j))$, where t refers to the time instant at which the characteristic reliability metric is calculated, j refers to the state at which the characteristic reliability metric is calculated, x refers to the state immediately antecedent to state j and belonging to the path selected as the surviving trellis path at state j, y refers to the state immediately antecedent to state j and belonging to the path designated as the closest competing path at state j, and $m(t,i,j)$ refers to an accumulated reliability metric which would result from a transition from state i at time instant t−1 to state j at time instant t.

5. A method according to claim 1, wherein at the final time instant there is a single allowed final state for the Viterbi decoding; and the step of converting the characteristic reliability metric of a selected final surviving trellis path to a sequence reliability statistic corresponds to taking the value of the characteristic reliability metric of the selected final surviving trellis path as the sequence reliability statistic.

6. A method according to claim 1, wherein at the final time instant there is a multitude of allowed final states for the Viterbi decoding and an immediately subsequent next encoded data sequence follows the final time instant; a memory length of a convolutional encoder used to previously encode the decoded data is known; and the step of converting the characteristic reliability metric of a selected final surviving trellis path to a sequence reliability statistic corresponds to the substeps of
   b') proceeding to a subsequent time instant within the immediately subsequent next encoded data sequence,
   c') at each state corresponding to the present time instant, selecting a surviving trellis path among the trellis paths coming into that state and updating a characteristic reliability metric separately in association with at least the extension of the surviving trellis path selected at the final time instant as the surviving trellis path,
   d') repeating steps b') and c') until an extended final time instant which is not closer to the final instant than the known memory length minus one, and
   e') at said extended final time instant updating a characteristic reliability metric in association with the extension of the trellis path selected at the final time instant as the surviving trellis path, and taking the value of the updated characteristic reliability metric as the sequence reliability statistic.

7. A decoding apparatus for Viterbi decoding a convolutionally encoded data sequence and for estimating the reliability of the data sequence after Viterbi decoding, comprising
   means for performing Viterbi decoding by propagating a number of trellis paths from a number of allowed states associated with a certain initial time instant to a number of allowed states associated with a certain final time instant through a number of allowed states associated with certain intermediate time instants, and by selecting, at each state associated with the intermediate time instants, a surviving trellis path and at the final time instant a final surviving trellis path; and
   means for updating, at each state associated with the intermediate or final time instants, a characteristic reliability metric separately in association with each selected surviving trellis path and means for converting the characteristic reliability metric of the selected final surviving trellis path to a sequence reliability statistic corresponding to the estimated reliability of the decoded data sequence.

8. A decoding apparatus according to claim 7, comprising means for initializing a selected number of characteristic reliability metrics at the beginning of the Viterbi decoding to a fixed maximum value.

9. A decoding apparatus according to claim 7, comprising means for extending the updating of the characteristic reliability metrics into time instants belonging to an immediately subsequent next data sequence.

10. A receiving device for reliably receiving encoded digital information in the form of superunits that consist of a predefined number of subunits, comprising
   means for generating Viterbi decoded subunits by propagating a number of trellis paths from a number of allowed states associated with a certain initial time instant within a subunit to a number of allowed states associated with a certain final time instant within the same subunit through a number of allowed states associated with certain intermediate time instants, and by selecting, at each state associated with the intermediate time instants, a surviving trellis path and at the final time instant a final surviving trellis path, means for updating, at each state associated with the intermediate or final time instants, a characteristic reliability metric separately in association with each selected surviving trellis path and means for converting the characteristic reliability metric of the selected final surviving trellis path to a sequence reliability statistic corresponding to the estimated reliability of the decoded subunit, for estimating the decoding reliability of each subunit contained within a superunit, error detection decoding means for generating a decoded superunit and detecting the number of errors in it and retransmission control means for identifying a predefined number of the subunits within the decoded superunit as suspicious on the basis of the estimated reliabilities of the subunits and the number of detected errors in the decoded superunit and for generating retransmission requests concerning the subunits identified as suspicious.

\* \* \* \* \*